(12) United States Patent
Cheung

(10) Patent No.: US 6,476,685 B1
(45) Date of Patent: Nov. 5, 2002

(54) NETWORK FOR PROVIDING GROUP DELAY EQUALIZATION FOR FILTER NETWORKS

(76) Inventor: William S. H. Cheung, 17/F, Sincere Insurance Building, Hennessy Road, Wanchai (HK)

( * ) Notice: Subject to any disclaimer, the term of this patent is extended or adjusted under 35 U.S.C. 154(b) by 0 days.

(21) Appl. No.: 09/516,241

(22) Filed: Mar. 1, 2000

(51) Int. Cl.[7] ............................. H03H 7/09; H03H 7/07; H03H 5/00
(52) U.S. Cl. ........................ 333/28 R; 333/140; 333/170
(58) Field of Search .............................. 333/28 R, 28 T, 333/140, 170, 139, 138, 156, 161, 177

(56) References Cited

U.S. PATENT DOCUMENTS

| | | | |
|---|---|---|---|
| 3,631,270 A | 12/1971 | Heinemann | 307/295 |
| 3,768,020 A | 10/1973 | Kurata | 325/347 |
| 3,935,550 A | 1/1976 | Adam et al. | 333/28 R |
| 4,395,688 A | 7/1983 | Sellers | 333/169 |
| 4,430,744 A | 2/1984 | Johnson | 375/14 |
| 4,885,562 A | * 12/1989 | Ouvrard et al. | 333/139 |
| 4,956,568 A | 9/1990 | Su et al. | 307/352 |
| 4,978,931 A | 12/1990 | Carp et al. | 333/28 R |
| 5,530,615 A | 6/1996 | Miller et al. | 361/160 |

FOREIGN PATENT DOCUMENTS

| | | | | |
|---|---|---|---|---|
| DE | 3724727 C1 | * | 7/1987 | H03H/7/19 |
| DE | 3724727 C1 | * | 12/1988 | H03H/7/19 |
| JP | 04-249478 | * | 9/1992 | H04N/5/14 |
| JP | 4-249478 A | * | 9/1992 | H04N/5/14 |

OTHER PUBLICATIONS

Handbook of Filter Synthesis, Anatol I. Zverev, 1967, John Wiley & Sons, pp. 46–47.*
Matsch—Electromagnetic & Electromechanical Machines $2^{nd}$ Edition—1972, 1977—Harper & Row.*
Zverev—Handbook of Filter Synthesis—1967—John Wiley & Sons, Inc.*

* cited by examiner

Primary Examiner—Robert Pascal
Assistant Examiner—Dean Takaoka
(74) Attorney, Agent, or Firm—Connolly Bove Lodge & Hutz LLP

(57) ABSTRACT

A circuit and method for creating an all pass network for equalizing the group delay of a filter. The all pass filter provides an equalization network including a transformer having a primary and secondary winding magnetically coupled together. One end of each primary and secondary winding is connected together to form a connection, the remaining ends of the primary and secondary winding constitute input and output terminals to the equalization network. Control over the group delay response is effected by a bias conductor serially connected to the common ends of the primary and secondary winding and a capacitor connected to the common terminal. The bias conductor modifies the mutual inductance, therefore modifying the coupling factor for the transformer. By shifting control of the coupling to the bias conductor, group delay response may be controlled without further modifications of the transformer coupling.

8 Claims, 10 Drawing Sheets

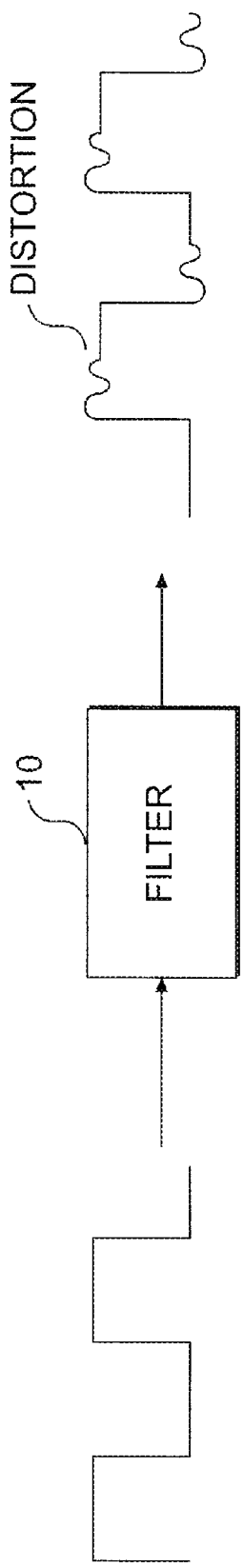
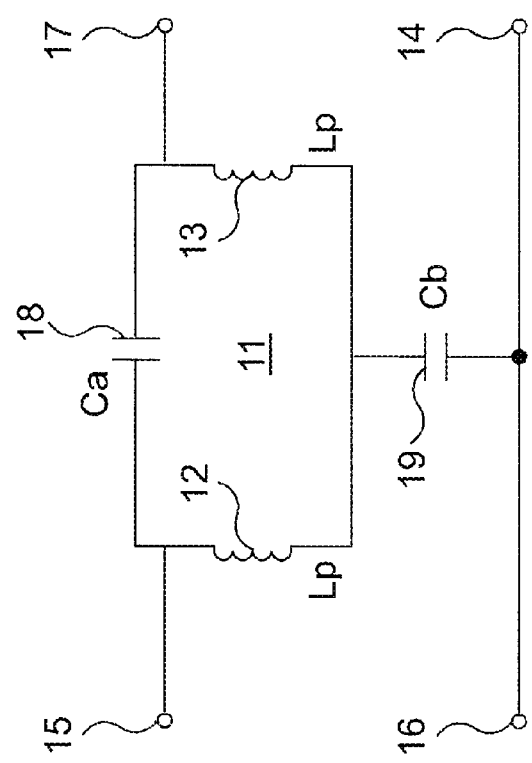
FIG. 1
FIG. 5A

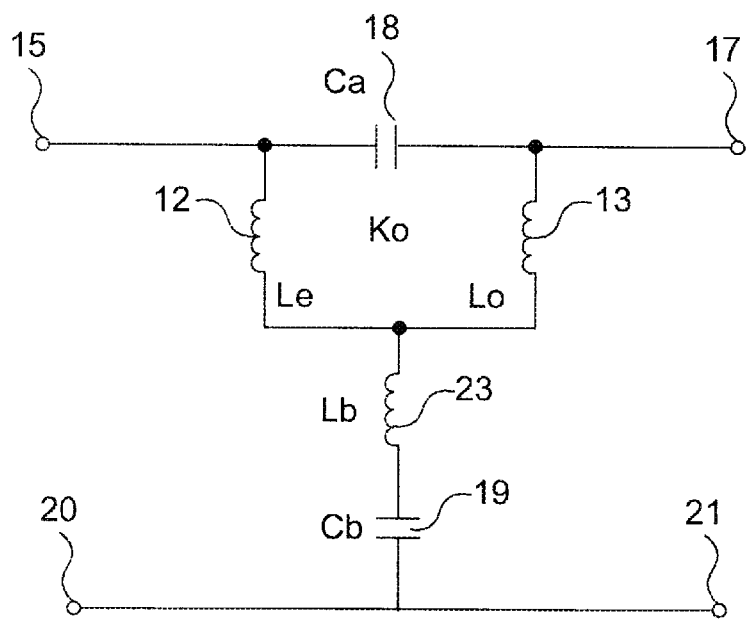
FIG. 6A
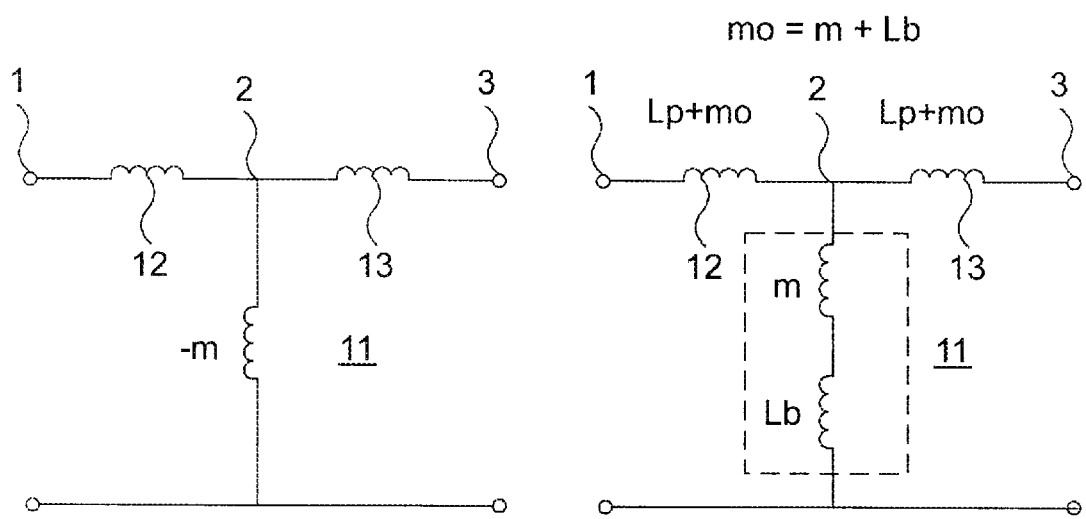
FIG. 6B  FIG. 6C

US 6,476,685 B1

NETWORK FOR PROVIDING GROUP DELAY EQUALIZATION FOR FILTER NETWORKS

BACKGROUND OF THE INVENTION

The present invention relates to high frequency signal processing. Specifically, a method and apparatus are described which provide for group delay equalization of network filters having a non-linear group delay.

In the field of telecommunications where analog and digital signal processing are necessary, filters, such as bandpass and lowpass filters, or delay lines are needed at various points in the signal processing network to condition a signal for further processing.

As is known to filter designers, not only must an amplitude passband be accurately designed in the filter, but care must be given to provide a uniform phase response for the signal processing components. When a pulse signal or an analog signal having a complex wave form is processed, an equal time delay must be given to all of the components in the signal in order to avoid significant distortion to the signal processed by the filter. In an ideal design, the signal produced by the network component should only differ in amplitude from the input signal. In practice, however, a nonlinear time delay over frequency in the passband of interest, representing a non-linear phase response for the network component, is experienced. As a measure of the distortion added to a complex signal by the non-linear phase response, the first derivative of the phase response versus frequency is defined as the group delay for the device which constitutes a measure of the distortion produced by the non-linear phase response.

In digital signal processing the distortion may take the form shown in FIG. 1. Each transition of the digital signal produces an amplitude distortion because of the non-linear effect of the phase delay through a filter 10 and may produce inaccurate data decoding. In the case of analog signal processing, a signal which had been amplitude modulated and subject to a non-uniform group delay distortion creates envelope delay distortion which deteriorates the output signal.

The well known problem of group delay distortion is usually addressed by providing phase correction networks having a phase response which is complementary to the network filter phase response. When the filter and phase correction network are connected in tandem, the overall phase response will be compensated in the frequency band of interest. FIG. 2 represents a performance analysis of a typical 30 MHz low pass filter without group delay equalization. The amplitude response of the filter extends to substantially 30 MHz, and then begins to roll off. The group delay performance of the filter, however, is not a uniform response curve in the bandwidth of interest as is the foregoing amplitude response curve. The time delay as shown in FIG. 2, representing the phase response for the lowpass filter, is non-linear. The time delay increases from 15 nanoseconds at 100 KHz to 18 nanoseconds at 5 MHz, and then to a peak of 70 nanoseconds at 33 MHz. The non-linear group delay creates the distortion referred to earlier when a complex signal is processed by the filter, and may be corrected using a group delay equalizer specifically designed to provide a group delay curve which is a complement to the group delay curve of the filter. FIG. 3 illustrates the uncorrected time delay curve C(1) of the filter, and the correction curve C(2) group delay of the network, respectively. When the two curves are added together, a substantially flat, constant delay time response C(3) inside the frequency spectrum of interest, i.e., DC to 30 MHz is realized. However, a consequence of combining the two networks to derive a constant group delay results in overall (constant) delay time for the combined filter and equalizer network.

Conventional group delay equalization is implemented using an all pass filter having constant amplitude/frequency response and a phase-versus-frequency response which complements the response being corrected. While these networks are capable of producing a compensating phase response, the design is typically not trivial. A number of filter sections may be required, and because of interactions between sections, a tedious trial and error design process may be needed to obtain the necessary phase response for equalizing group delay.

SUMMARY OF THE INVENTION

The present invention provides for an all pass equalization network. The all pass equalization network includes a transformer which has a primary and secondary winding which effects the group delay function for the network. A bias inductor is connected to one of the ends of the primary and secondary winding, and to a common terminal for modifying the transformer coupling so that the group delay through the equalization network may be accurately controlled.

In a preferred embodiment of the invention, a second order all pass filter is constructed having a network Pole-zero (Q) <1. One end of a primary winding, and one end of a secondary winding is connected, respectively, to the input and to the output of the filter, and the remaining ends of the primary and secondary winding are connected to each other. A coupling factor for the transformer is modified by a bias inductor connected to the primary and secondary remaining ends. A first and second capacitor are connected, respectively, between the input and output terminals of the all pass filter, and between the remaining end of the inductor and a common terminal.

The value of the bias inductor is selected to modify the slope of the group delay function of the all pass filter. By controlling the value of the bias inductor, the entire coupling factor for the transformer can be modified to a precisely theoretical design value.

DESCRIPTION OF THE FIGURES

FIG. 1 illustrates the distortion of a digital signal from nonlinear group delay;

FIG. 5A is a schematic diagram of a conventional second order all pass filter section of pole and zero Q <1;

FIG. 6A is a schematic diagram of an equalizer network according to a preferred embodiment of the invention;

FIG. 6B is a four terminal network model of the transformer of FIG. 5A;

FIG. 6C is a four terminal network model of the transformer of FIG. 6A;

DESCRIPTION OF A PREFERRED EMBODIMENT

All pass filter networks which generally exhibit a flat amplitude—frequency response, and a predetermined group delay response versus frequency, are classified as delay time equalizers. Placing a number of such all pass networks in cascade, each having a specified group delay response for each individual network over a frequency spectrum of interest, can provide a non-linear response which is complementary to a desired filter group delay response.

Figure 2:
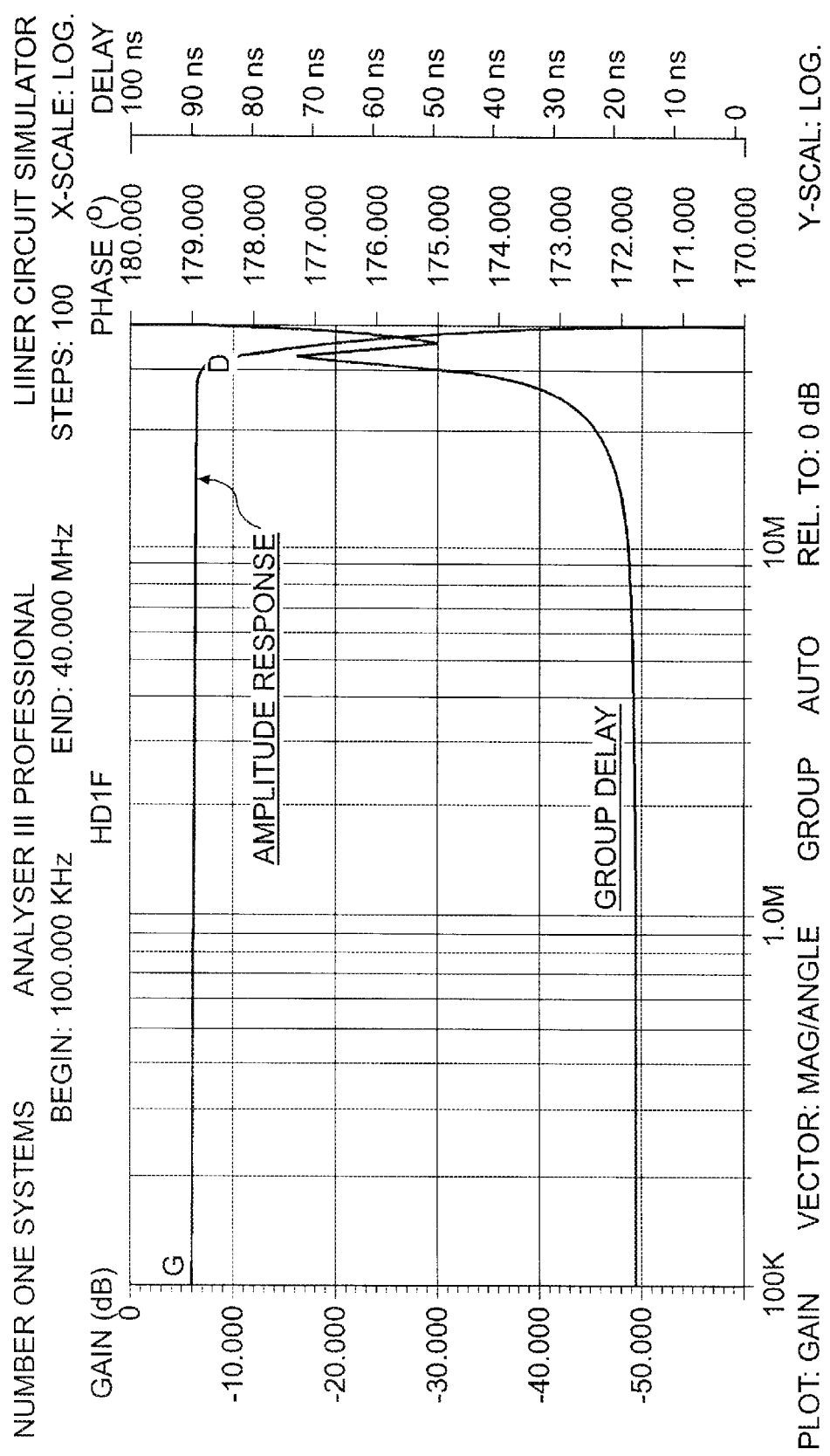
FIG. 2 illustrates the typical amplitude and group delay response for a standard lowpass filter.
Figure 3:
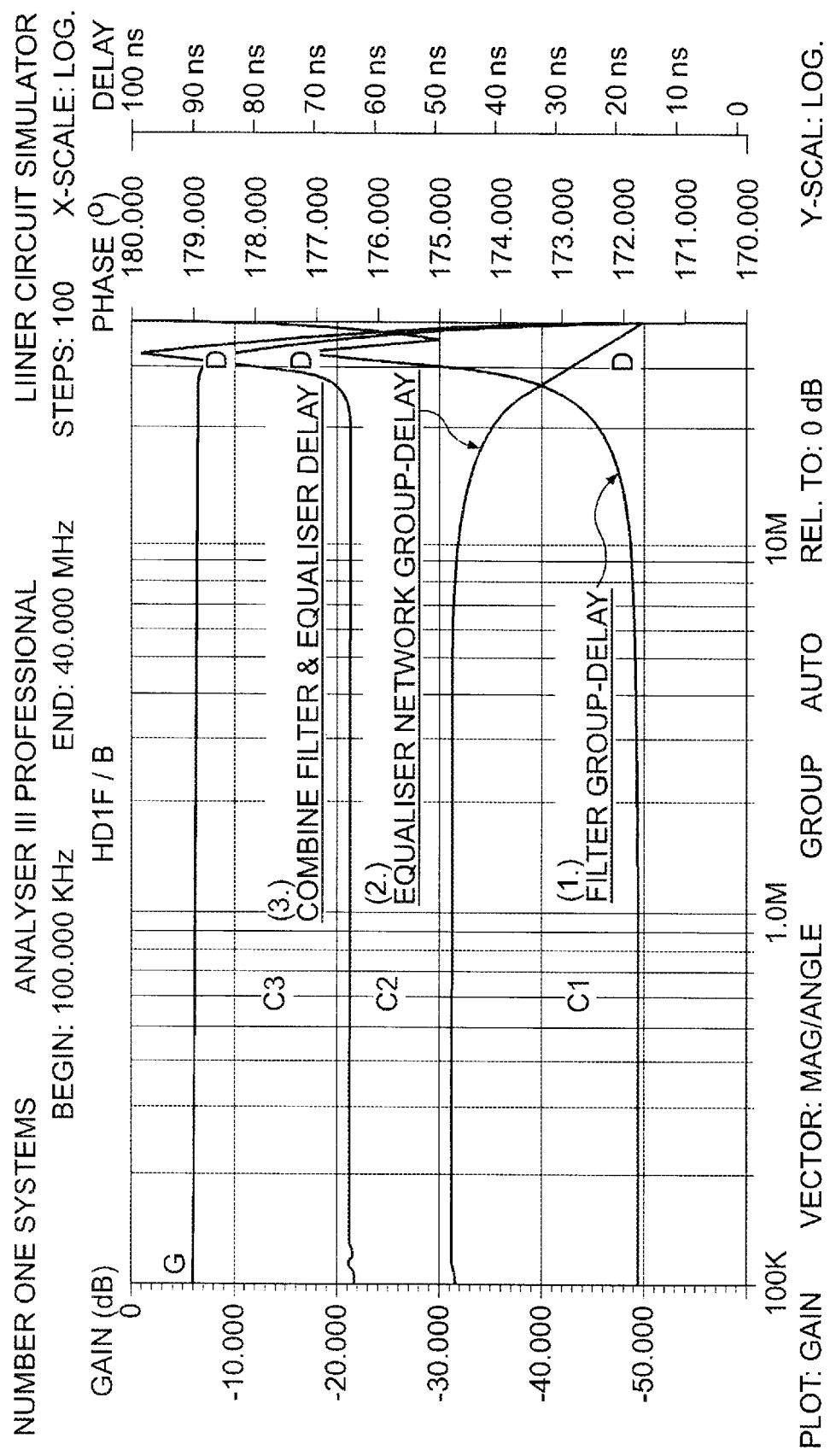
FIG. 3 illustrates the delay for the filter and an equalizer which compensates for the filter delay.
Figure 4B:
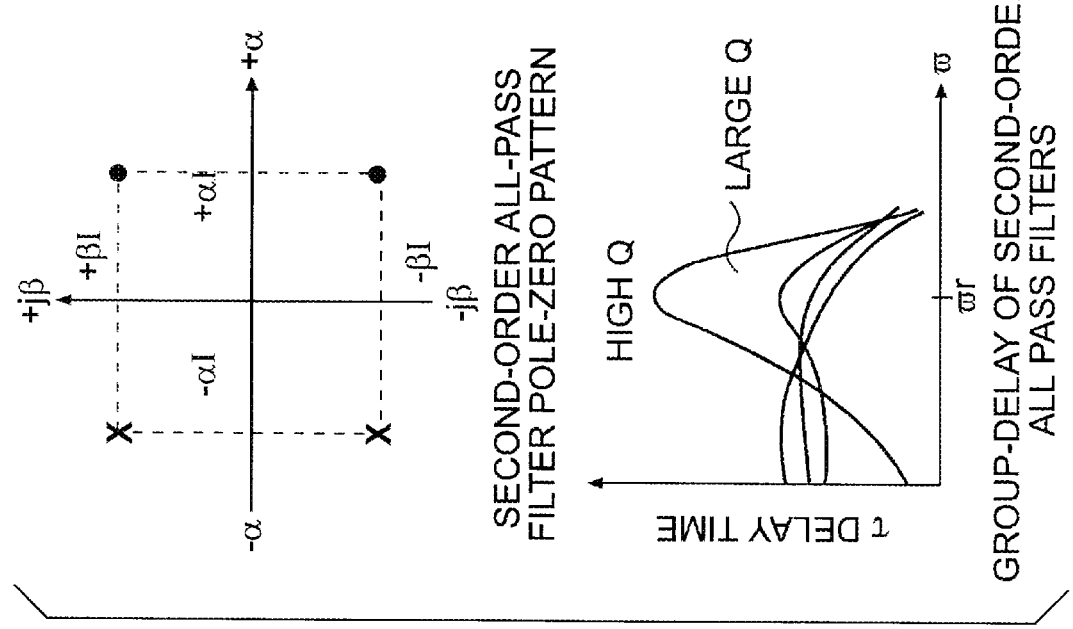
FIG. 4B illustrates the group delay for second order lowpass filter along with its pole zero pattern.
Figure 4A:
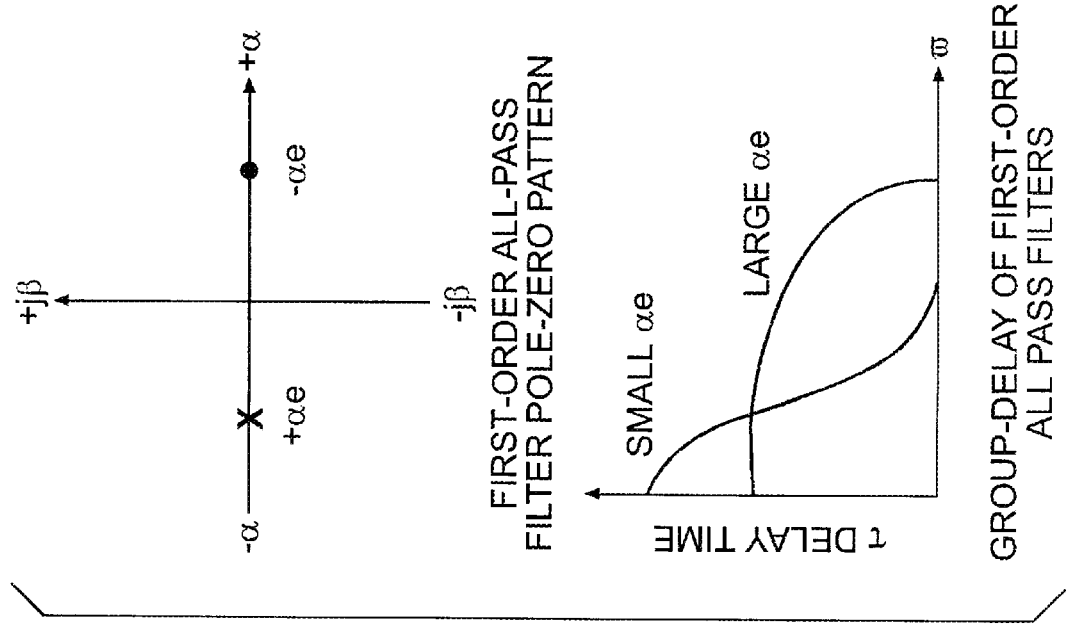
FIG. 4A illustrates group delay for first a order lowpass filter along with its pole zero pattern.

All pass filters are generally classified into three categories: A first order all pass, second order all pass with Pole-zero (Q) <1, and a second order all pass with Pole-zero (Q) >1 having a group delay response curve and pole-zero pattern illustrated in FIGS. 4A and 4B.

Figure 5B:
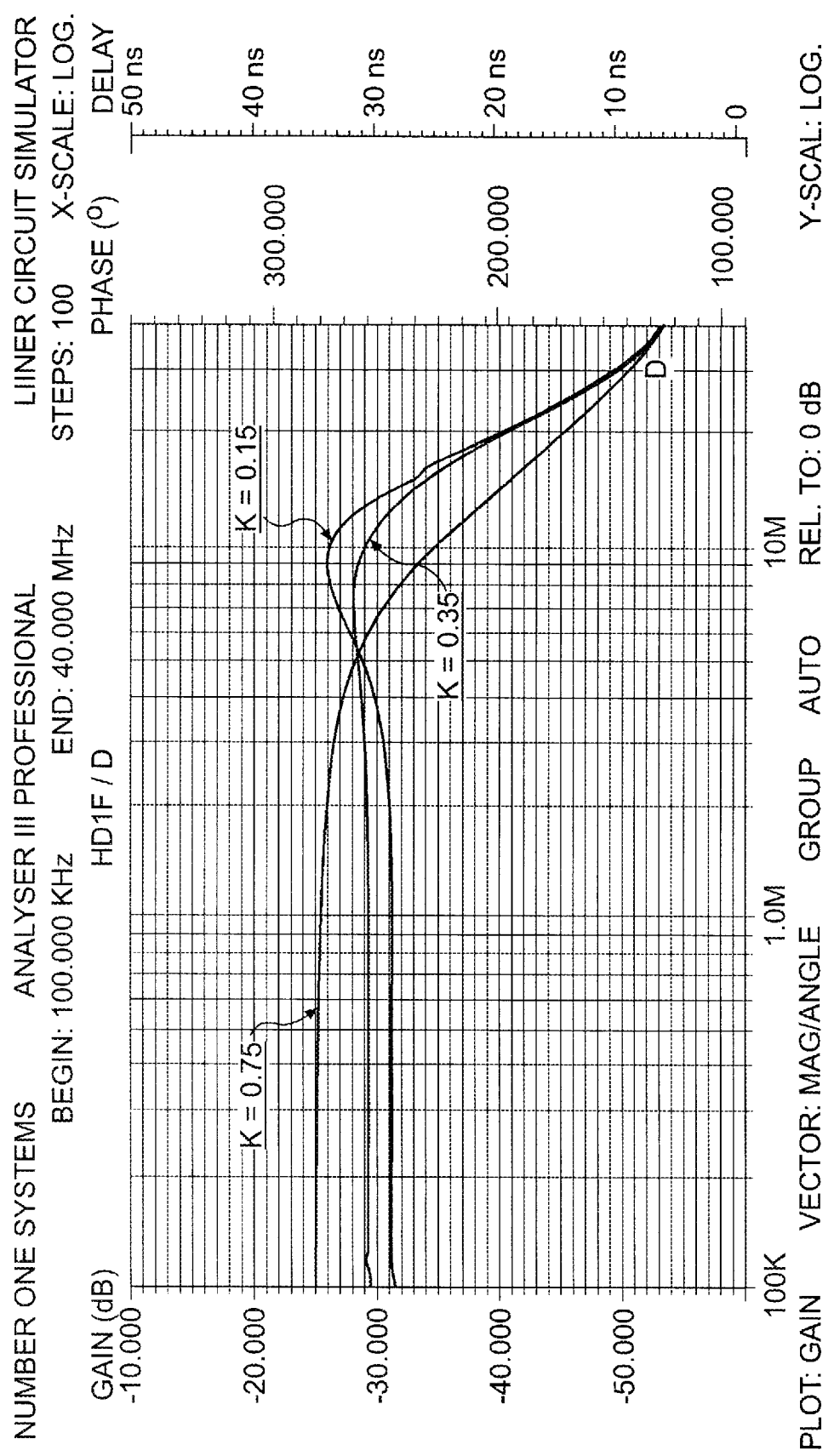
FIG. 5B is an illustration of the effect of transformer coupling K of the filter of FIG. 5A on group delay response.

A preferred embodiment of this invention is implemented as a second order all pass filter having a Pole-zero (Q) <1. The second order all pass filter of this type is shown in FIG. 5A for controlling the final group delay for the overall all pass filter and network which is to be group delay compensated. The slope of the group delay for the all pass filter is very much affected by the coupling factor K of the RF transformer 11. By varying the K factor, the entire group delay response of the all pass filter may change from a negative going slope to a positive going slope at a selected frequency. The effect of the coupling factor K on the RF transformer 11 on the group delay response for the prior art all pass filter of FIG. 5A is shown more particularly in FIG. 5B.

In order to achieve the desired group delay response, the actual coupling factor K of the transformer 11 should be as close as possible to the theoretical design value for the passband of interest. The second order all pass filter of FIG. 5A has a nominal value of Q <1. The transformer has a first primary winding 12 and a secondary winding 13. The primary winding 12 has one end which forms an input terminal 15, and the secondary winding 13 has an end which forms an output terminal 17. The remaining ends of the primary and secondary windings are connected together, and to one side of the capacitor 19. The other side of the capacitor 19 is connected to common terminals 14 and 16.

The all pass filter network has a substantially constant amplitude versus frequency function in the bandwidth of interest. The component values for each of the components are selected to satisfy the following where $K = (1-Q)/(1+Q)$ $Lp = [(Q+1)*R]/2*Q*\omega_r$ $Ca = Q/(2*\omega_r*R)$ $Cb = 2/(Q*\omega_r*R)$.

K represents the coupling coefficient for the transformer having primary winding 12 and secondary winding 13. The inductance for each of the primary and secondary windings 12 and 13 is determined as Lp. The values Ca and Cb for the coupling capacitors 18, 19 are determined from the R network impedance looking into and out of output terminals 15 and 17 respectively, and $\omega_r$ is the network pole-zero resonant frequency. The intrinsic coupling factor K of the transformer 11 is effected by the physical distance between the two windings, magnetic coupling angle between the two windings, core material and wire inductance, and the coil winding form factor and construction. While it is relatively easy to select the value of a capacitance and winding inductance for the all pass network within a ±1% tolerance, precise control over the coupling factor K is significantly difficult.

In order to control the coupling factor K, the present invention provides for an external bias inductor in the return path of the commonly connected ends of primary winding 12 and secondary winding 13. The second order all pass filter section of FIG. 5A can be modified as shown in FIG. 6A to include a biasing inductor which will be connected as shown to modify the coupling factor K for the transformer 11. The prior art network of FIG. 5A is modeled as a four-terminal network as shown in FIG. 6B which compares with the model of the four-terminal network in FIG. 6C of the second order all pass filter of FIG. 6A. In both of these models, Lp is the winding inductance of the primary winding 12 and the secondary winding 13, and m is the mutual inductance of the transformer primary and secondary windings 12, 13.

The analysis of the four-terminal network of FIG. 6B includes for the input terminals 15, 20 of the device, a primary winding inductance 12 which is as follows: (Lp+m)−m=Lp. At the output terminals 17, 21, the secondary winding 13 inductance can be represented as: (Lp+m)−m= Lp. The total inductance Lt between input and output can be obtained by adding the impedance between 1 and 2, and 2 and 3 as: (Lp+m+Lp+m)=2Lp+2m=Lt.

From the above, the total inductance of the RF transformer windings in series can also be expressed in terms of a coupling factor K, instead of m, the mutual inductance. In this instance the coupling factor $K = m/(Lp*Ls)^{1/2}$. Since Lp=Ls, therefore K=m/Lp or m=KLp.

Since m represents the mutual inductance between windings of the transformer, the mutual coupling parameter can be modified by adding an external bias inductor 23 to the common return point for the transformer 11 as shown in FIG. 6A. The inductor 23 constitutes a bias inductor having inductance Lb which is connected in series with the mutual inductance m illustrated in FIG. 6C. The net effect of the mutual inductance m is a change in the overall mutual inductance Mo and the transformer coupling factor K. Thus, instead of controlling the design coupling factor K precisely, it is possible to use either a fixed bias coil or an adjustable inductor to modify K and the final group delay response curve.

The use of the bias inductor 23 to modify the coupling factor K also modifies the total inductance Lt of the transformer 11 since mo=m+Lb, and Lt=2(mo+Lp). In order to avoid a change in the filter frequency of operation, the winding inductance of the primary and the secondary windings Lp, Ls can be adjusted to retain the total inductance Lt, as modified by the bias inductor 23 value Lb. The modified filter provides the identical amplitude/frequency response as the original design without the bias inductor 23, however, group delay is varied, as is shown in FIG. 5B by changing the value of the coupling factor K by changing the value of the bias inductor 23.

Figure 7:
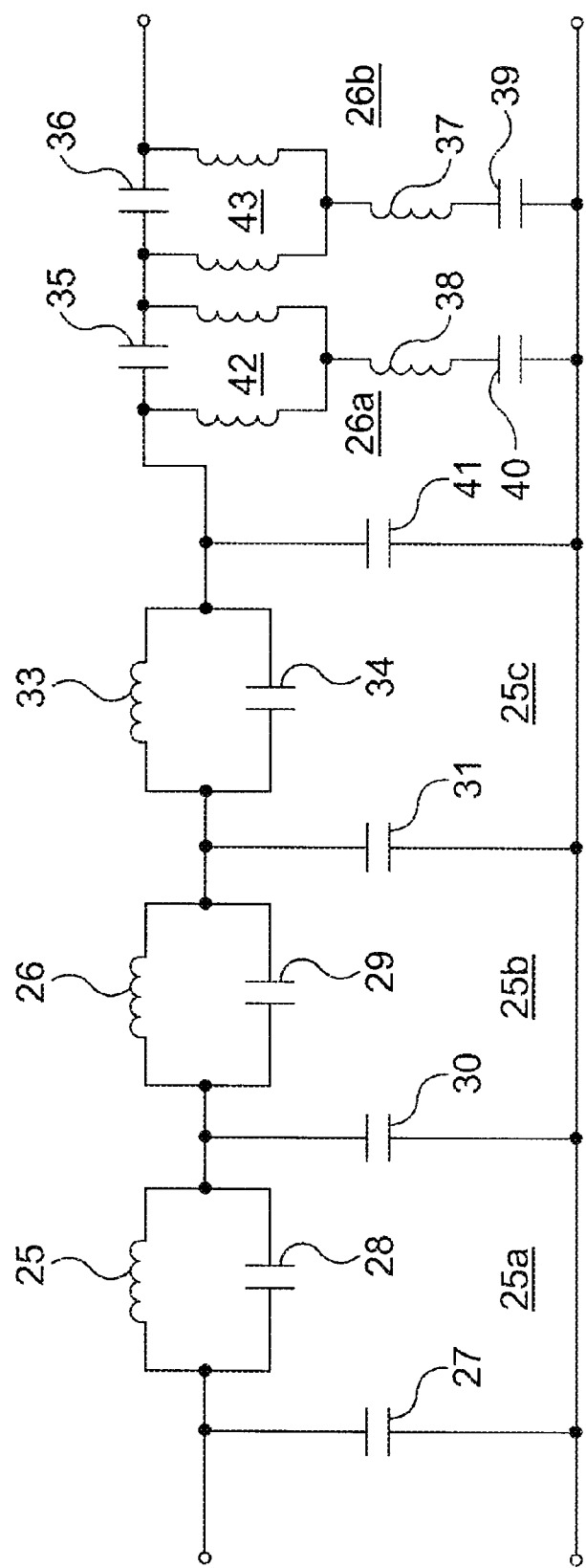
FIG. 7 is an illustration of a lowpass filter which is equalized using the all pass filter equalizer structure according to FIG. 6A.

As a practical application of the present invention, a lowpass filter having group delay equalization is shown in FIG. 7 using the foregoing principles. The filter comprises a three-section lowpass filter 25, serially connected with two second order all pass filters 26a and 26b having a Q <1. The basic component values for the all pass filters are determined from the formulas which describe the all pass filter of FIG.

5A which does not include the bias inductor. The transformer primary and secondary winding 11, 12 of each of the sections of the all pass filter are wound so as to be slightly larger than the calculated primary and secondary winding inductance LP. The actual coupling factor Ko from the circuit is larger than the design factor K, so that Ko>K.

Once the actual coupling factor Ko for the transformer 28 is determined from measurements of a circuit made from the design calculations, the value of the bias coil inductor 23 is calculated from the following equation: Lb=[2*Ko*Lp*(1+K)]/[(2*(1+Ko)]−(K*Lp) where Lp is the winding inductance of the primary and secondary winding. The winding inductance Lp must, as noted above, be modified in order to preserve the group delay response of the all pass filter structure. The new winding inductance Ln is calculated as: Ln=[2*Lp(1+K)]/[2*(1+Ko)], where Lp is the inductance from the design calculation, K=transformer coupling factor from the design calculation, and Ko=actual coupling factor measured from the transformer.

The filter of FIG. 7 has the group delay equalization controlled by the bias inductor 37, 38 value Lb and utilizes the recalculated inductance value for the primary and secondary windings of the transformer. The group delay performance of a standard design filter, using an equalization which is obtained from an all pass filter not having the bias inductor, is substantially the same as for the embodiment of FIG. 7, however, by controlling the K factor using a bias inductor, the implementation is much simpler.

The specifications for the lowpass filter are more particularly set out in the table below.

| | |
|---|---|
| Zo Impedance | 75 ohm |
| Passband, Fv | 30 MHz |
| Passband ripple | <0.25 dB |
| Start of Stop Band, Fs | 44.25 MHz |
| Stopband attenuation at 200 MHz | >40 dB |
| Attenuation at 37.125 MHz | >12 dB |
| Attenuation at 54.25 MHz | >45 db |
| Passband Group Delay ripple | <7 ns |
| Passband Group Delay control to | 27 MHz |
| Flat loss at 100 KHz | 1.5 dB max. |
| Typical Group Delay | 65 ns +/− 5 ns |

The component values for the lowpass filter of FIG. 7 which produce the foregoing performance specifications were determined as follows:

| Ref. No. | Component | Value |
|---|---|---|
| Filter Sections 25a, 25b, 25c: | | |
| 25 | inductor | .47 μh |
| 26 | inductor | .404 μh |
| 27 | capacitor | 38 pf |
| 28 | capacitor | 8.2 pf |
| 29 | capacitor | 37.7 pf |
| 30 | capacitor | 88.5 pf |
| 31 | capacitor | 82 pf |
| 33 | inductor | .334 μh |
| 34 | capacitor | 23.4 pf |
| 41 | capacitor | 21 pf |
| All pass filter sections 26a and 26b: | | |
| 35 | capacitor | 33 pf |
| 36 | capacitor | 36.2 pf |
| 37 | inductor | .122 μh |
| 38 | inductor | .109 μh |
| 39 | capacitor | 204.5 pf |
| 40 | capacitor | 433 pf |

-continued

| Ref. No. | Component | Value |
|---|---|---|
| 42 | transformer | K = .55<br>Lp = .328 μh<br>P/S ratio 1:1 |
| 43 | transformer | K = .78<br>Lp = .68 μh<br>P/S ratio 1:1 |

Figure 8A:
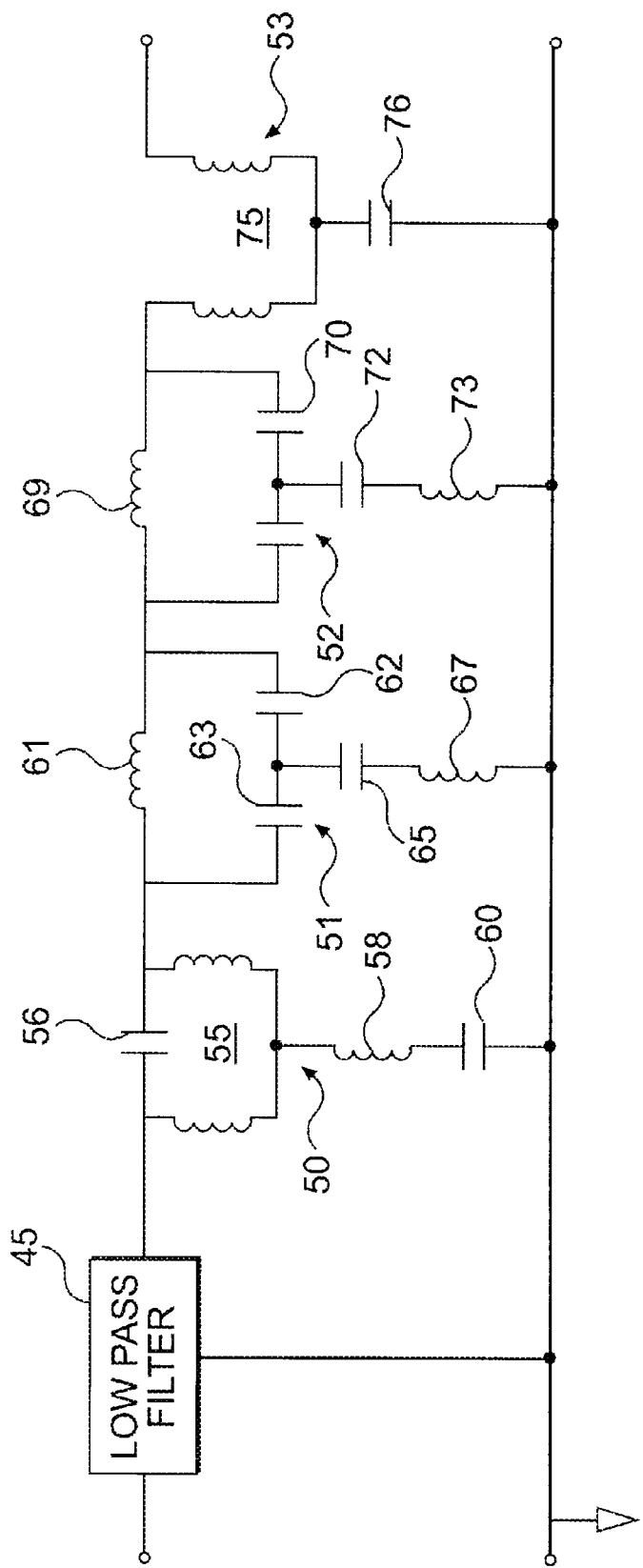
FIG. 8A illustrates a low pass filter which is equalized using both second order all pass filters having a Q <1, as well as filters having a Q >1.

While the foregoing is one example of using a second order all pass filter having a Q <1, to equalize the phase response of a low pass filter 45, FIG. 8A illustrates yet another embodiment of the invention. In the embodiment of FIG. 8A, equalization is effected not only by a second order low pass filter having a Q <1, 50, but by second order all pass filters having Q >1, 51, 52, and a first order all pass filter 53. Thus, further phase response compensation can be effected by utilizing these other well known structures in combination with the second order all pass filter 50.

The second order all pass filter 50, having a Q <1, is constructed according to design techniques described previously. Capacitors 56 and 60 are selected in accordance with the parameters Ca and Cb previously described. Further, the transformer comprising a primary winding and secondary winding of transformer 55 is designed having the inductance Lp selected according to the foregoing description.

Bias inductor 58 is calculated to have an inductance Lb as set forth previously.

The values for each of the components 55–60 are given below.

| Ref. No. | Component | Value |
|---|---|---|
| 55 | transformer | K = .78<br>Ratio-1:1<br>Lp = Ls 42 μh |
| 56 | capacitor | 300 pf |
| 58 | bias inductor | 1.25 μh |
| 60 | capacitor | 2670 pf |
| The filter 45 has the following characteristics: | | |
| Low Pass Filter | | |
| Group-delay Ripple | | +/− 3 ns |
| Group-delay equalized to | | 5.5 MHz |
| Pass Band | | 5.75 MHz |
| Pass Band amplitude Ripple | | 0.2 dB |
| Input/Output Z | | 75 ohm |
| Group-delay equalized to | | 5.5 MHz |
| Pass Band | | 5.75 MHz |
| Pass Band amplitude Ripple | | 0.2 dB |
| Input/Output Z | | 75 ohm |

The second order all pass filters 51 and 52 are standard second order all pass filters with a Pole-zero (Q) >1. The first order all pass filter 53 is a standard first order all pass filter having a large output zero real pole and zero coordinate. The values for each of these filter components are as follows:

| Ref. No. | Component | Value |
|---|---|---|
| 61 | inductor | 5.3 μh |
| 62 | capacitor | 632 pf |
| 63 | capacitor | 632 pf |
| 65 | capacitor | .01 μf |
| 67 | inductor | 1.8 μh |
| 69 | inductor | 2.83 μh |
| 70 | capacitor | 720 pf |

-continued

| Ref. No. | Component | Value |
| --- | --- | --- |
| 71 | capacitor | 720 pf |
| 72 | capacitor | 773 pf |
| 73 | inductor | 9 μh |
| 75 | transformer | K = .98 |
| 75 | transformer | K = .98 Ratio = 1:1 Lp, Ls = 3.47 μh |
| 76 | capacitor | 2.4 pf |

Figure 8B:
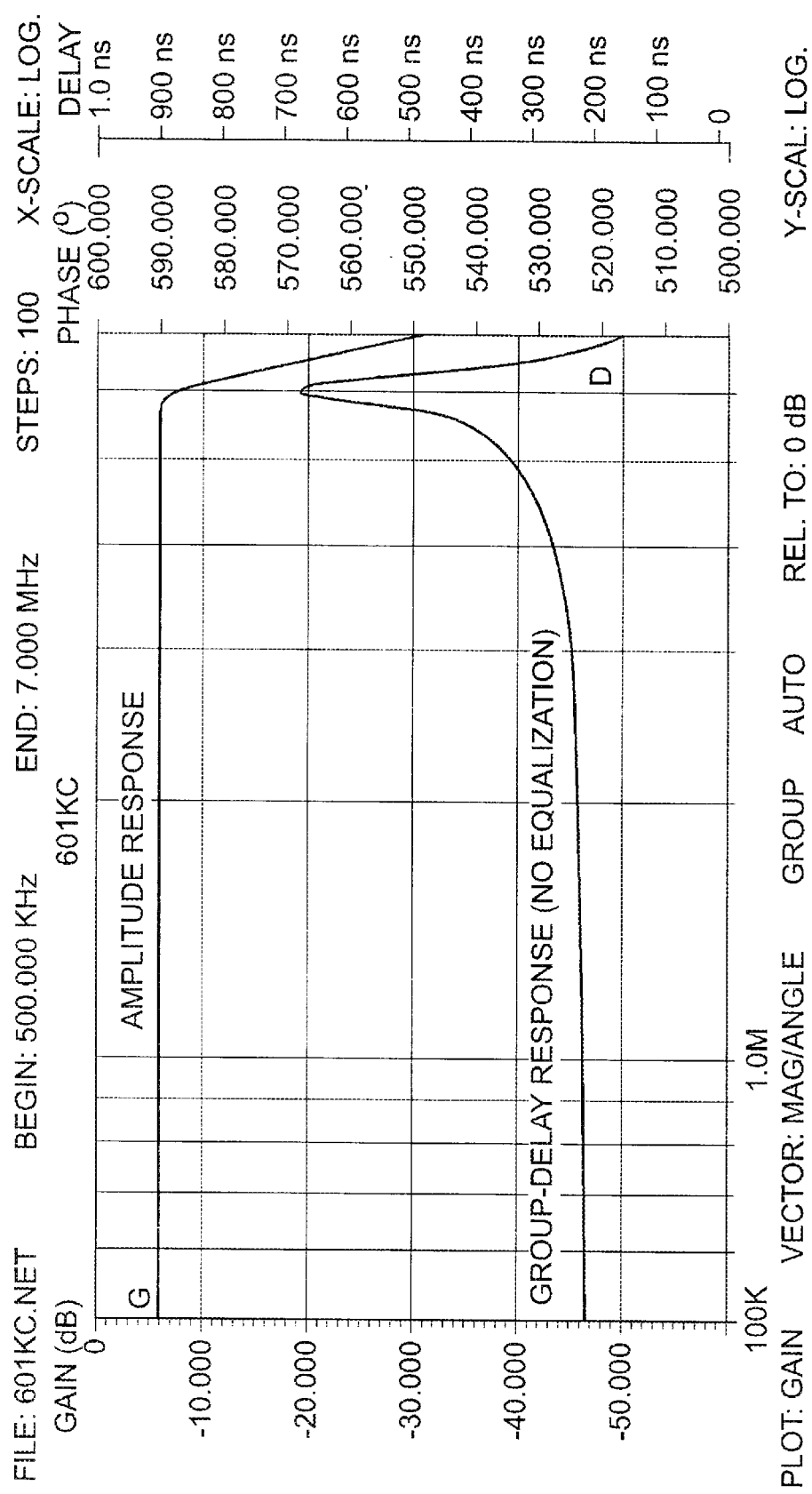
FIG. 8B illustrates an amplitude and group delay response for the low pass filter 45 before equalization.
Figure 8C:
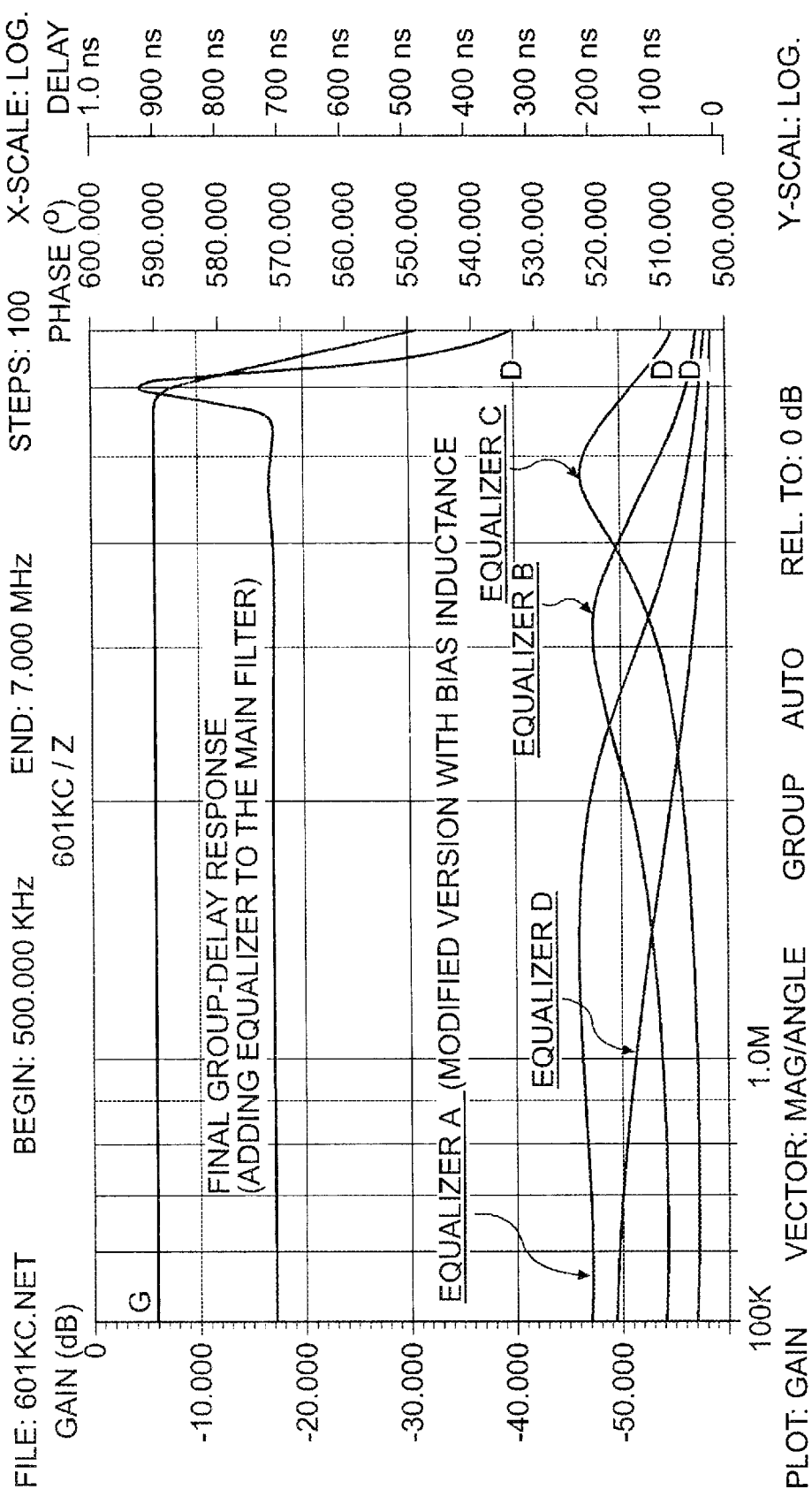
FIG. 8C illustrates the gain group delay response for the equalized low pass filter circuit of FIG. 8A.

The performance of the circuit of FIG. 8A will full equalization can be compared to a low pass filter without any group delay equalization. FIG. 8B shows the group delay response when there is no equalization, showing a significant nonlinear response at the higher end of the filter bandwidth.

In contrast thereto, the result of the additional phase compensation provided by each of the all pass filters 50, 51, 52 and 53 provide a substantially linearizing effect so that the group delay response is more linear in the lower frequency limits of the filter bandwidth.

The foregoing shown as merely an example of how the present invention utilizing a second order all pass filter of Q <1 can be utilized in combination with other standard equalization techniques to achieve a desired group delay response.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. An equalization network for compensating a non-linear group delay function comprising:
   a transformer having a primary winding and a secondary winding magnetically coupled together said primary and secondary windings having respective inductance of Lp and Ls, and a theoretical coupling factor K controlling the mutual inductance between said primary and secondary windings, and a measured coupling factor Ko;
   a first capacitance connected between first ends of said primary and secondary windings, forming and input terminal with said primary winding and an output terminal with said secondary winding;
   a bias inductor connected to second ends of said primary and secondary windings having an inductance which is determined by: $Lb=\{[2*Ko*Lp*(1+K)]/[2*(1+Ko)]\}-(K*Lp)$
   where Lp is the calculated winding inductance;
   K is the calculated coupling factor for the transformer;
   Ko is the measured coupling factor of the transformer; and
   a capacitor connecting a second end of said bias inductor to a common terminal, said inductor modifying said transformer coupling between said primary and secondary windings to obtain substantially a coupling factor of K, and said primary and secondary windings inductances Lp, Ls are modified to obtain a desired group delay response of a second order all pass network having a circuit pole -zero Q less than one based on said theoretical and actual coupling factors K and Ko whereby the phase delay through said network may be accurately controlled.

2. The equalization network for compensating a non-linear group delay function according to claim 1 wherein said network forms a second order all pass filter function with group delay controlled by said bias inductor.

3. An equalization network for compensating a non-linear group delay function comprising:
   an input terminal;
   an output terminal;
   a common terminal; and
   a second order all pass filter having a substantially flat amplitude response, said filter including a transformer having a primary winding and a secondary winding magnetically coupled together; first ends of said primary and secondary windings being connected, respectively to said input and output terminal, said primary and secondary having an inductance which establishes a frequency of operation for said filter, said filter further including a bias inductor connected to second ends of said primary and secondary windings and to said common terminal to control said coupling factor and said primary and secondary windings having value selected to offset the inductance contributed by said inductor to the total inductance of said primary and secondary windings.

4. The equalization network according to claim 3 wherein said all pass filter has a Q factor which is less than one.

5. The equalization network according to claim 4 wherein said all pass filter provides a constant group delay.

6. A second order all pass filter having a network pole zero (Q) less than 1 comprising:
   a transformer having a primary winding and secondary winding, one end of said primary and secondary windings being connected to respective input and output of said filter, the remaining ends of said primary and secondary windings being connected to each other, said windings having a theoretical coupling factor which is defined as $(1-Q)/(1+Q)$ of a value K;
   a first capacitor connected between said one ends of said primary and secondary windings having a value defined by $Q/(2\omega_r*R)$ where $\omega_r$ is the all pass filter network pole-zero resonant frequency for the all pass filter, and R is the network impedance;
   a second capacitor having a value defined by $2/(Q*\omega_r*R)$ connected at one end to a common terminal; and
   a bias inductance connected between said primary and secondary remaining ends and said second capacitor remaining end, said bias inductance having a value of $Lb=\{[2*Ko*Lp*(1+K)]/[2*(1+Ko)]\}-(K*Lp)$, where Ko is the measured coupling factor for said transformer and Lp is the calculated primary and secondary winding inductance.

7. The all pass filter of claim 6 further comprising a lowpass filter section connected to said input, having a group delay which is substantially equalized by said all pass filter group delay.

8. The all pass filter according to claim 6 wherein said primary and secondary winding inductance Ln is determined as $[2*Lp*(1+K)]/[2*(1+Ko)]$.

* * * * *